INVENTOR
Bent Bulow Jacobsen.
William John Mitchell
BY
Robert Harding Jr.
ATTORNEY

ELECTRIC WAVE FILTER

INVENTOR
BENT BULOW JACOBSEN.
WILLIAM JOHN MITCHELL
BY Robert Harding Jr.
ATTORNEY INVENTOR
BENT BULOW JACOBSEN
WILLIAM JOHN MITCHELL
BY Robert Harding Jr.
ATTORNEY INVENTOR
BENT BULOW. JACOBSEN.
WILLIAM JOHN. MITCHELL
BY Robert Harding Jr.
ATTORNEY Patented Sept. 23, 1952 2,611,874

UNITED STATES PATENT OFFICE 2,611,874

ELECTRIC WAVE FILTER

Bent Bulow Jacobsen and William John Mitchell, London, England, assignors, by mesne assignments, to International Standard Electric Corporation, New York, N. Y., a corporation of Delaware Application January 5, 1946, Serial No. 639,289
In Great Britain January 1, 1945

Section 1, Public Law 690, August 8, 1946
Patent expires January 1, 1965

5 Claims. (Cl. 250—36)

The present invention relates to electric wave selective networks or filters, and particularly, though not exclusively, to filters employed in oscillator circuits.

The principal object of the invention is to limit the change of phase supplied by waves transmitted through the filter so that it does not approach close to 180° at any frequency.

It is well known that the change of phase in wave filters often tends to approach closely to plus or minus 180° outside the pass bands. For example, this is usually true of half section filters. In oscillation circuits which include tuned transformers (which are equivalent to filters) this large phase change is often the cause of oscillation at undesired frequencies.

An oscillator which filters according to the present invention may be applied with advantage is of the kind described in British Patent Specification No. 510,379. This is known as the bridge stabilised type of oscillator, and comprises a feedback path including a Wheatstone bridge containing a resonant circuit in one arm and a thermal resistance element in another. The feedback path is coupled to the amplifier path by two tuned transformers, and it has been found that the transformers introduce large phase changes which produce spurious oscillation frequencies.

It is very undesirable to introduce reactance elements into the bridge for the purpose of preventing oscillations at undesired frequencies, since the stability at the desired frequency would be impaired.

One well known method of avoiding this trouble involves the introduction of a phase compensating network in the amplifier. The use of coupling filters according to the present invention offers another and in some respects a better solution, though it may be used if desired in addition to the known methods.

It will be understood, of course, that this is not the only possible application of the filters according to the present invention. They may be used wherever their special properties can be usefully employed.

According to the invention there is provided an electric wave selective network comprising an electric wave filter terminated at one end by a resistance, and by-path means associated therewith and so disposed that when an alternating voltage is applied to the input of the network a voltage is obtained at the output of the network which is a combination of a voltage proportional to the input voltage, and a voltage proportional to the voltage at the output of the said filter.

According to another aspect, the invention provides an electric wave selective network comprising an electric wave filter terminated at one end by a resistance, and by-path means associated therewith and adapted to reduce the phase change suffered by waves transmitted through the network so that the said phase change is substantially less than 180° at any frequency.

The invention will be described with reference to the accompanying drawings in which.

In this specification reference will be made to the text book "Transmission Networks and Wave Filters," by T. E. Shea, published by the D. Van Nostrand Co., 1929.

Figure 1:
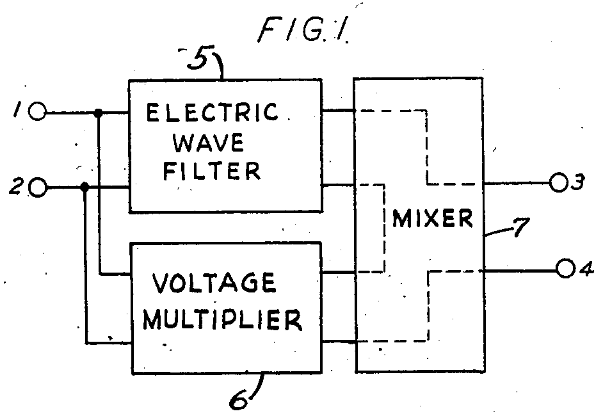
Fig. 1 shows a block schematic diagram of a selective network according to the invention.

Fig. 1 shows in block schematic form the basic arrangement of a selective network or filter according to the invention. The input terminals of the filter are designated 1 and 2 and the output terminals are designated 3 and 4. The block 5 is an electric wave filter of any type, and the block 6 is a circuit or device connected to the input terminals 1 and 2 and adapted to derive at its output a certain fraction or multiple of the voltage applied at the input of the filter 5. The outputs of the blocks 5 and 6 are connected to a mixing device 7 adapted to produce at the output terminals 3 and 4 a voltage proportional to the sum or difference of the voltages at the outputs of blocks 1 and 6. The device 6 may not contain any actual apparatus, and may consist simply of two direct conductors, or it may be an attenuator, transformer, or another filter; or it may contain an amplifier. Likewise the device 7 may contain a mixing valve or valves for example, or other apparatus, or again it may be simply connecting conductors as indicated by the dotted lines.

It will be seen that the device 6 forms a by-path to the output for a proportion of the input voltage. For this reason the type of filter according to the invention will be called a "by-path filter."

Provided there are no one-way devices, such as valves, in any of the blocks 5, 6 or 7, then as is well known, the terminals 3 and 4 can be used as input terminals and 1 and 2 as output terminals, and the by-path filter will have the same transmission properties.

Figure 2:
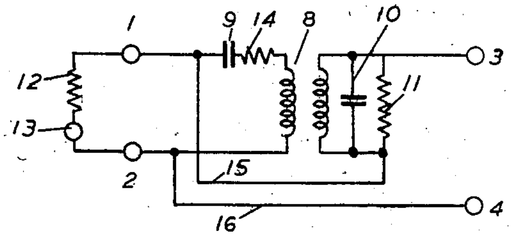
Figs. 2 and 3 show schematic circuit diagrams of two embodiments.

Fig. 2 shows the details of a simple by-path filter according to the invention. It comprises a transformer 8 series tuned on the input side by a condenser 9, and parallel tuned on the output side by a condenser 10. The transformer 8 is terminated on the output side by a load resistance $R_2$ designated 11, and the resistance 12 represents the input load connected to the terminals 1, 2. A generator 13 is shown connected in series with the resistance 12 to represent the source of the waves applied to the filter. The resistance 14 represents the resistance component $r$ of the primary winding of the transformer 8. The total resistance of the elements 12 and 14 is $R_1$, and $R_2$ includes the shunt resistive component of the tuned secondary winding of the transformer 8.

The transformer 8 together with the condensers 9 and 10 is equivalent to a half section of a band pass filter of type IV*k* shown in Fig. 168A of the above-identified textbook "Transmission Networks and Wave Filters" by T. E. Shea, with an ideal transformer with a step-up ratio of $\varphi^2$, where $\varphi^2=R_2/R_1$. This may be shown by a series of transformations of the network elements according to well known principles, as set out for example in the articles by E. K. Sandeman in the "Wireless Engineer" September and October, 1941. The filter constituted by the elements 8, 9, 10 and 14 will be called the "prototype filter" for convenience.

One terminal of the secondary winding of the transformer 8 is connected to the output terminal 3 and the other terminal is connected by a conductor 15 to the input terminal 1. The output terminal 4 is connected to the input terminal 2 by the conductor 16.

The inductances of the transformer windings and the capacities of the condensers 9 and 10 should be chosen according to formulae which will be given later so that the prototype filter is correctly terminated at its terminals by the loads $R_1$ and $R_2$ respectively. It will be seen that the output voltage at the terminals 3 and 4 is equal to the sum of the voltage across the load 11 and the voltage across the input terminals 1, 2.

In this particular form of the by-path filter it is assumed that the output load to which the terminals 3 and 4 are to be connected is of substantially infinite impedance, such as the control grid circuit of a valve.

At the mid-band frequency of the filter, the reactance of the filter as seen from the terminals 1, 2 will be zero, and if 2E is the electromotive force of the generator 13 then the voltage contributed by the by-path will be $E(r+R_1)/R_1$, while the output voltage of the prototype filter developed across the resistance $R_2$ will be $\varphi$E.

The design formulae for the by-path filter of Fig. 2 will now be given. The following list gives definitions of the symbols used:

$f$=the frequency variable
$f_1$ and $f_2$=lower and upper cut-off frequencies
$f_m$=mid-band frequency$=\sqrt{f_1 f_2}$
$\omega, \omega_1, \omega_2, \omega_m = 2\pi f, 2\pi f_1, 2\pi f_2, 2\pi f_m$, respectively
$R_1$=input image impedance of prototype filter at $f_m$
$R_2$=output image impedance of prototype filter at $f_m$
$\varphi^2=R_2/R_1$
$P$=primary winding inductance of transformer 8
$S$=secondary winding inductance of transformer 8
$k$=coupling factor of transformer 8
$M$=mutual inductance of transformer 8 $=k\sqrt{PS}$
$C_1$=capacity of condenser 9
$C_2$=capacity of condenser 10
$B=\omega_m/(\omega_2-\omega_1)$ (the band width factor)
$x=B(\omega/\omega_m-\omega_m/\omega)$
$p=(R_1-r)/R_1$
$m=\varphi+2-p$ As explained in Sandeman's article, for example, it can be shown that for the design of the prototype filter, $$P=R_1(B+1/B)/\omega_m$$
$$S=R_2/\omega_m B$$
$$M=\sqrt{R_1R_2/\omega_m B}$$
$$C_1=1/B\omega_m R_1$$
$$C_2=B/\omega_m R_2$$

The discrimination factor of a filter is the factor which determines the practical performance of the filter, and is defined as the vector ratio of the output voltage at the terminals 3 and 4 at the frequency $f_m$, to the output voltage at any other frequency $f$, it being assumed that the input voltage at terminals 1 and 2 is the same at both frequencies. The discrimination is the logarithm of the discrimination factor, and the real part of this logarithm is also equal to the difference between the attenuation through the filter at the frequency $f$ and the attenuation at the mid-band frequency $f_m$, this difference being preferably expressed in decibels. Thus in an ideal band-pass filter the magnitude of the discrimination factor would be equal to 1 over the pass band, and would be infinite outside the pass band. Such a condition is, of course, never attainable in practical filters.

Now it can be shown that the discrimination factor of the by path filter is equal to $1/(a+jb)$ where $$a+jb=\frac{2x^4+2m(2-x^2)+2(1-p)x^2}{m(4+x^4)}+jx\frac{2(2-2m+x^2)+2(1-p)(2-x^2)}{m(4+x^4)}$$

This is perhaps most easily shown by expressing the prototype filter in the form of the corresponding half section type IV*k*. assuming that the prototype filter is terminated in the manner explained, and then working out the output/input voltage ratio at terminals 3, 4 and 1, 2 for any value of $x$. In this calculation, the output voltage is, of course, the sum of the normal output voltage of the prototype filter and the input voltage at terminals 1, 2. By putting $x=0$ the corresponding value of the ratio is obtained for the mid-band frequency. The ratio of the two values so obtained is the required discrimination factor, and it will be found more convenient to work out the reciprocal of the discrimination factor in the form $a+jb$ as indicated above.

The magnitude of the discrimination factor is then $1/\sqrt{a^2+b^2}$ and the phase angle $\theta=\tan^{-1} b/a$.

By putting $x^2=\infty$ it can be shown that the discrimination measured in decibels tends to the asymptotic value $20 \log_{10} (\psi+2-p)$ on either side of the pass band, and the phase change tends to zero instead of to plus or minus 180°.

Figure 4:
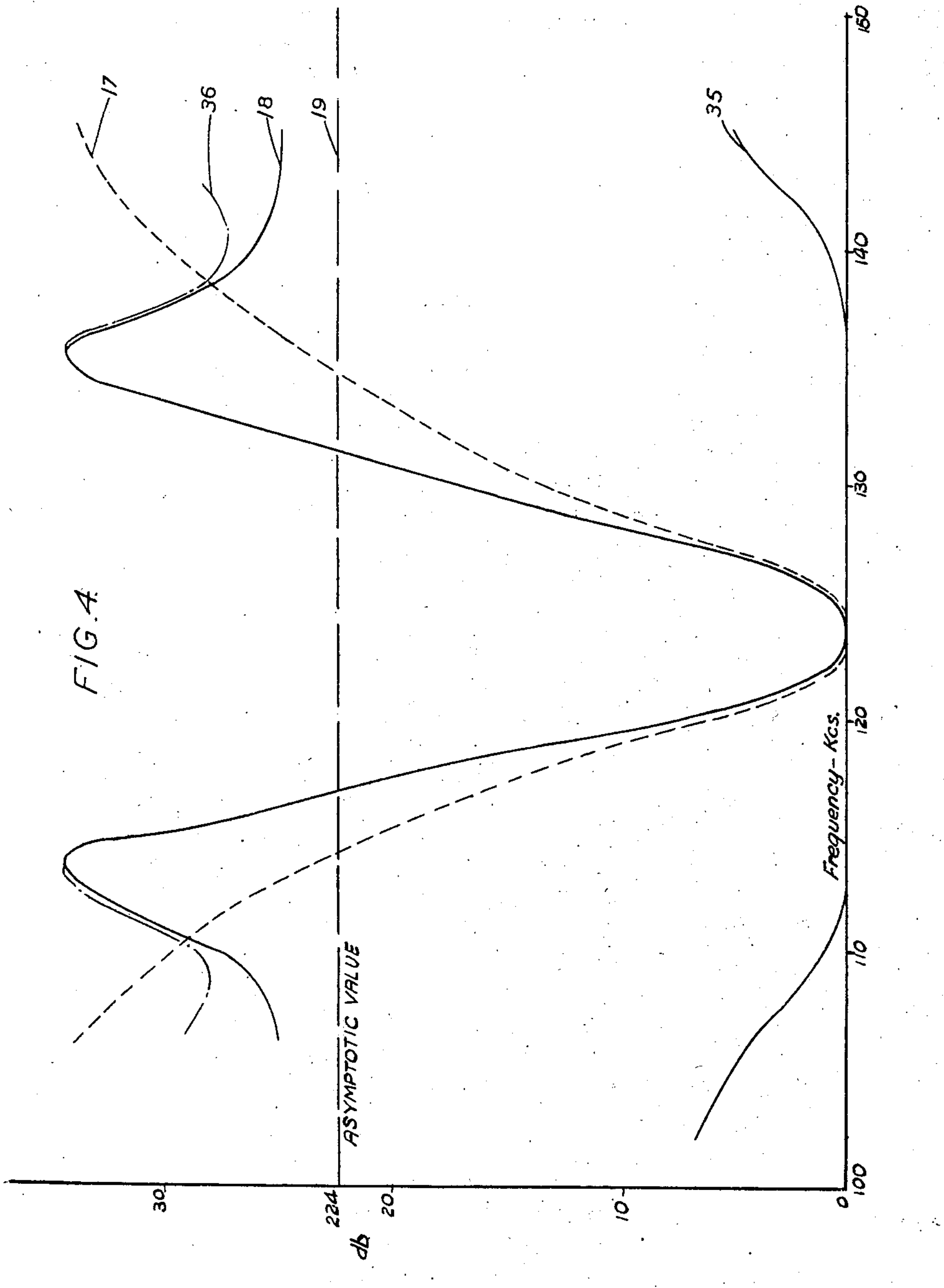
Figs. 4 and 5 show respectively the attenuation-frequency characteristics and the corresponding phase-change-frequency characteristics for a selective network according to the invention.
Figure 5:
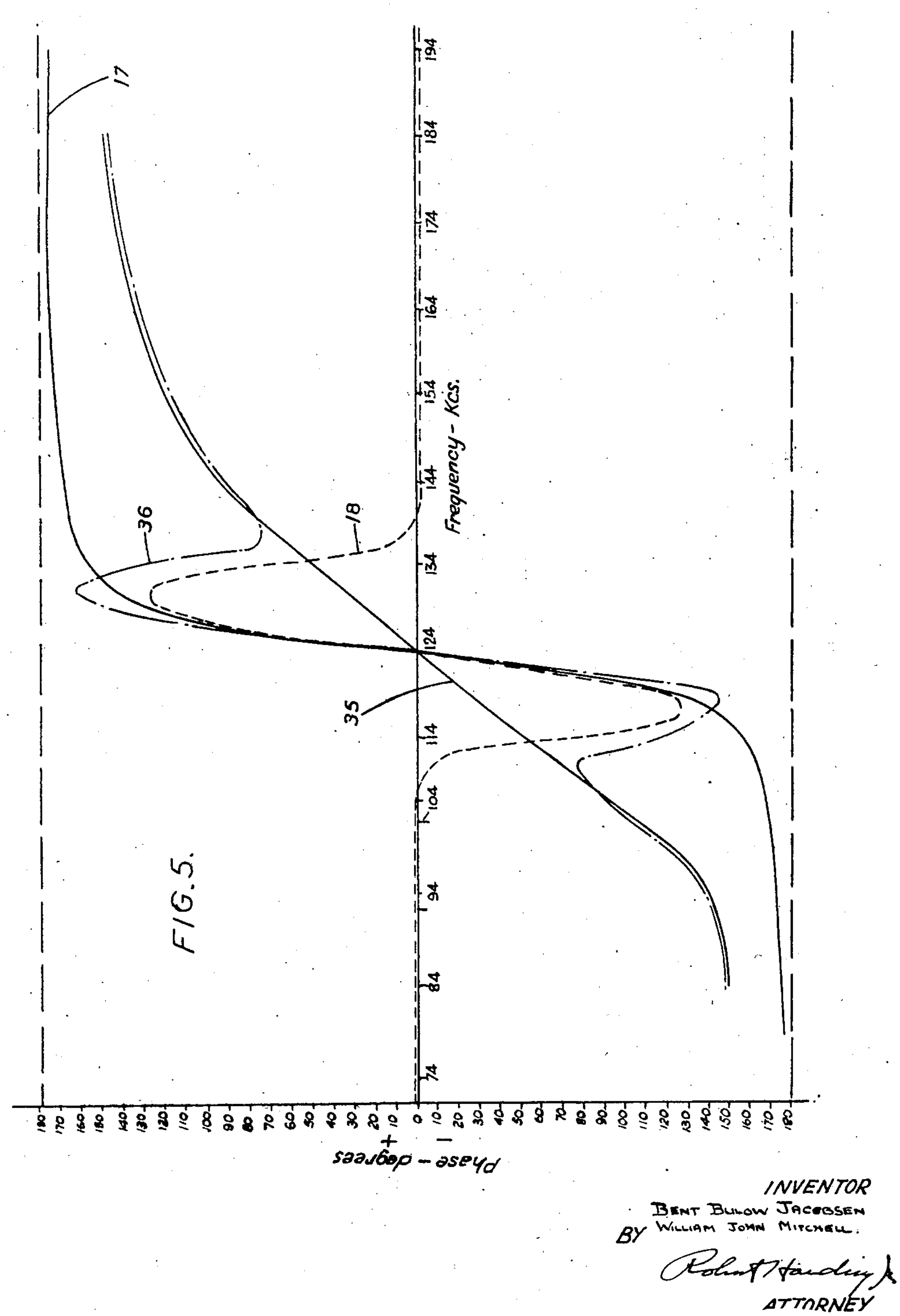

The curves shown in Figs. 4 and 5 illustrate the results obtained in a particular case of Fig. 2. The following were the design requirements:

$B=32.5$
$p=2/3$
$\psi=25$
$f_m=124$ kilocycles per second, from which it follows that
$f_1=122.1$ kcs., and
$f_2=125.9$ kcs.

Fig. 4 gives the discrimination and Fig. 5 the corresponding phase change. In each of these figures the curve designated 17 refers to the prototype transformer filter without the by-path feature, and that designated 18 refers to the by-path filter according to Fig. 2. The line 19 in Fig. 4 gives the asymptotic value of the discrimination. It will be seen from Fig. 5 curve 17 that while the phase change for the prototype filter rapidly approaches closely to ± 180°, that of the by-path filter (curve 18) does not exceed about 127° anywhere, and tends ultimately to zero on either side of the band. The curves 17 and 18 of Fig. 4 show that in the by-path filter the cut off has been somewhat sharpened at the expense of a relatively low asymptotic discrimination of about 22½ *db.*

The other curves shown in Figs. 4 and 5 will be explained later.

Referring again to Fig. 2, it will be understood that the proportion of the input voltage transferred to the output by the by-path may be varied in a number of ways, and its sign may be reversed. Thus a transformer (not shown) may be interposed in the conductors 15 and 16 by which a step-up or step-down may be produced. Alternatively, an attenuator, or amplifier, may be included, or another filter adapted to pass at least those frequencies where a phase change reduction is required. Any combination of such elements might be used. It will be understood that the particular numerical case for which the curves of Figs. 4 and 5 have been drawn is given to illustrate the design of a by-path filter according to the invention, and that filters meeting other requirements can be designed in a similar manner. The amount of phase change reduction obtained depends on $\psi$ and $p$, which should be chosen accordingly. The greater the reduction required the smaller will be the asymptotic discrimination.

The filter of Fig. 2 is intended to work into a substantially infinite impedance such as the control grid circuit of a valve, which will be connected to terminals 3 and 4. The filter could also be used in the opposite direction. Thus the terminals 3 and 4 could be connected to a high impedance source such as the anode circuit of a pentode valve, and would then deliver the waves to a circuit of impedance $R_1-r$.

Figure 3:
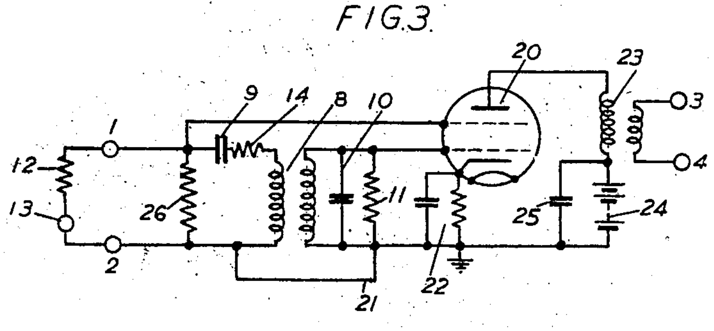

If it is desired to work the by-path filter between two impedances, neither of which is substantially infinite, the arrangement of Fig. 3 may be used. In this figure those elements which are the same as in Fig. 2 have been given the same designations and will not again be described. The addition of the two voltages is effected by a valve 20 having two control grids, one of which is connected direct to terminal 1, and the other to the upper end of the secondary winding of the transformer 8. The lower ends of the two windings are connected together by the conductor 21 and are grounded. The cathode of the valve 20 is earthed through a conventional bias network 22 and the anode is connected through the primary winding of a transformer 23 to the high tension source 24 which is shunted by a by-pass condenser 25. The secondary winding of the transformer 23 is connected to the output terminals 3 and 4. A high resistance grid leak 26 is provided for the first mentioned control grid.

It is obvious that the output current of the valve 20 will be proportional to the vector sum of the voltages applied to the two control grids. One of these voltages is proportional to the output voltage of the prototype filter, and the other is proportional to the input voltage. The ratio of the transformer 23 may evidently be designed to match the impedance of any desired output load connected to terminals 3 and 4.

In order to vary conveniently the proportions of the voltages applied to the two grids, these grids may be connected, for example, to adjustable taps (not shown) on the respective resistances 11 and 26 instead of as shown in Fig. 3. It is obvious that the valve 20 and its associated circuit may be varied in a number of well known ways. If there is a direct current path through the input load 12, the leak resistance 26 would not be necessary and could be omitted. The valve should, however, be biassed so that it operates normally. If the grid nearer to the anode is a screen grid, it could be polarized positively through a suitable resistance (not shown) in the usual way. As an alternative arrangement the addition of the two voltages might be effected by two separate valves operating into a common load.

It is emphasised that the prototype filter need not be of the type IV*k*; it need not contain an actual transformer at all, and is not necessarily a transforming filter or even a band-pass filter. The by-path principle can be applied to any electric wave filter for the purpose of reducing or modifying the phase change produced thereby.

Figure 6:
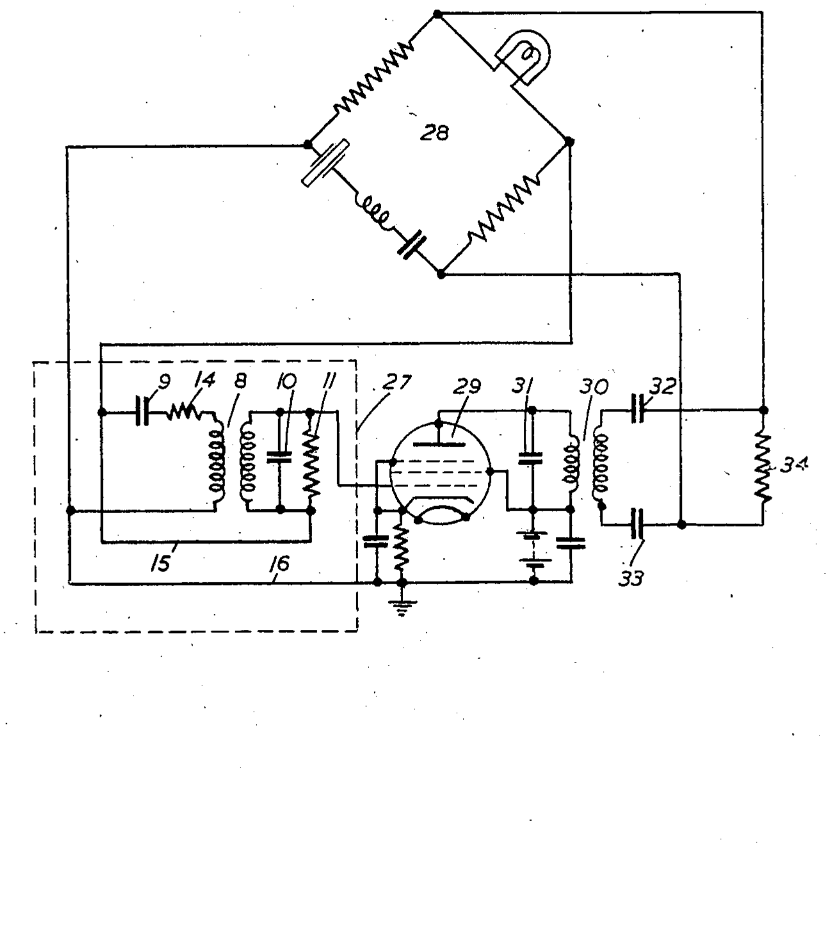
Fig. 6 shows a schematic circuit diagram of an oscillator employing a selective network according to the invention.

Fig. 6 shows one example of the application of a by-path filter according to the invention. It is employed in a bridge stabilised oscillator of the kind described in patent specification No. 510,379. Fig. 6 is a re-drawing of Fig. 1 of that specification in order to show how the by-path filter may be included. The by-path filter is shown in the dashed outline 27 and includes the elements 8, 9, 10, 11, 14, 15 and 16 described above with reference to Fig. 2. The by-path filter connects one pair of diagonal corners of the bridge 28 to the control grid circuit of the valve 29, the anode circuit of which is connected to the other pair of diagonal corners of the bridge 28 through a transformer 30 having a condenser 31 shunting the primary winding and condensers 32 and 33 in series with the balanced secondary winding. The resistance 34 represents the output circuit to which the oscillations are delivered.

The elements 30, 31, 32 and 33 constitute a half section transforming band pass filter of type IV*k* and should preferably be designed in the manner to be explained presently. The valve 29 with its associated circuit and the bridge 28 are arranged substantially in the same way as explained with reference to Fig. 1 of specification No. 510,379 and the circuit as a whole operates similarly except for the reduction in the phase change which is brought about by the use of the by-path filter according to the invention.

Assuming, for example, that the circuit is designed to oscillate at 124 kilocycles per second, the by-path filter 27 may be designed to meet the requirements specified in the numerical example given above, to which the curves of Figs. 4 and 5 apply. The elements 30, 31 and 32 should preferably be chosen according to the formulae given above for the prototype filter to produce a rather wider band than the by-path filter also centred on 124 kcs.

For example B may be taken as 6.5. The value of $\varphi$ will be decided by the impedances between which the filter has to work. The attenuation and phase change curves for this filter are designated 35 in Figs. 4 and 5. The curves representing the combined effect of the two filters are designated 36. Referring to Fig. 5 it will be seen from curve 36 that the phase change does not exceed about 162° in the neighborhood of the pass band, and never reaches 180° at any frequency. This means that the total phase change through the filter and amplifier circuit cannot approach near to an odd multiple of $\pi$ except at the mid-band frequency, which is the desired frequency of oscillation. It is therefore possible to increase the gain of the amplifier indefinitely without causing oscillation at undesired frequencies. Reference to the curves 17 and 35 of Fig. 5 shows that with two prototype filters, the total phase change for the two filters will be equal to $\pi$ in the neighbourhood of the cut off frequency of the narrower band filter (at about 132 kcs.), with the result that the circuit may oscillate at the wrong frequency if high gains are used.

When applying the principle of this invention to an oscillator, the transformers or filters should preferably be designed for different band widths and the by-path principle should preferably be applied to the one with the narrower band. In Fig. 6, the two filters could have been interchanged so that the by-path filter is at the output of the valve instead of at the input. Actually both the filters could be by-path filters according to the invention if desired.

What is claimed is:

1. A frequency selective network comprising a first pair of terminals, a second pair of terminals, a pair of parallel wave transmission paths connecting the first and second pairs of terminals, one of said paths being by itself substantially direct and non-frequency discriminating, the other path comprising a frequency band transmission filter, a resistance terminating said filter and common to both paths to limit the phase change of waves transmitted through the paths to said second pair of terminals to less than 180 degrees at any frequency, said filter including a first condenser and the primary winding of a transformer forming a series tuned combination across the first pair of terminals, and said resistance being shunted across the secondary winding of said transformer together with a condenser to provide a parallel tuned combination across the second pair of terminals.

2. A frequency selective network according to claim 1, in which both of said combinations are tuned to the mid-frequency of the band of frequencies to which the network selectively transmits.

3. A frequency selective network comprising a first pair of terminals, a second pair of terminals, a pair of parallel wave transmission paths connecting the first and second pairs of terminals, one of said paths being by itself substantially direct and non-frequency discriminating, the other path comprising a frequency band transmission filter, a resistance terminating said filter and common to both paths to limit the phase change of waves transmitted through the paths to said second pair of terminals to less than 180 degrees at any frequency, said second set of terminals being connected across the input circuit of a grid-controlled electron tube, the output of said electron tube being coupled through a highly selective additional network to the first pair of terminals.

4. A frequency selective network according to claim 3, in which said additional network comprises a bridge having two sets of conjugate points, one set of conjugate points being connected to the output of said electron tube, and the other set of conjugate points being connected to said first pair of terminals.

5. A frequency selective network according to claim 4, in which said bridge has in one arm thereof means highly resonant to a particular frequency and in another arm thereof means including a temperature dependent resistance.

BENT BULOW JACOBSEN.
WILLIAM JOHN MITCHELL.

REFERENCES CITED

The following references are of record in the file of this patent:

UNITED STATES PATENTS

| Number | Name | Date |
|---|---|---|
| 1,759,952 | McCurdy | May 27, 1930 |
| 1,902,031 | Holden | Mar. 21, 1933 |
| 1,968,237 | Weyers | July 31, 1934 |
| 2,031,100 | Engel | Feb. 18, 1936 |
| 2,163,403 | Meacham | June 20, 1939 |
| 2,240,450 | Wolfskill | Apr. 29, 1941 |
| 2,261,286 | Rankin | Nov. 4, 1941 |